(12) United States Patent
Joo et al.

(10) Patent No.: US 7,321,503 B2
(45) Date of Patent: Jan. 22, 2008

(54) METHOD OF DRIVING MEMORY DEVICE TO IMPLEMENT MULTIPLE STATES

(75) Inventors: Won Jae Joo, Gyeonggi-do (KR); Yoon Sok Kang, Gyeonggi-do (KR); Kwang Hee Lee, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 121 days.

(21) Appl. No.: 11/229,708

(22) Filed: Sep. 20, 2005

(65) Prior Publication Data
US 2006/0160307 A1    Jul. 20, 2006

(30) Foreign Application Priority Data
Jan. 20, 2005    (KR) .................... 10-2005-0005444

(51) Int. Cl.
*G11C 11/00*    (2006.01)
(52) U.S. Cl. ...................... 365/148; 365/115
(58) Field of Classification Search ................ 365/148, 365/115
See application file for complete search history.

(56) References Cited

U.S. PATENT DOCUMENTS

| | | | |
|---|---|---|---|
| 5,270,965 A | | 12/1993 | Yanagisawa et al. |
| 5,389,475 A | * | 2/1995 | Yanagisawa et al. ......... 430/19 |
| 6,910,933 B1 | * | 6/2005 | Matsuo et al. ................ 445/24 |
| 2002/0163057 A1 | | 11/2002 | Bulovic et al. |
| 2004/0027849 A1 | | 2/2004 | Yang et al. |

FOREIGN PATENT DOCUMENTS

JP    62-95882    5/1987

OTHER PUBLICATIONS

M. Bauer et al., "A Multilevel-Cell 32Mb Flash Memory", IEEE, ISSCC Digest of Technical Papers, 1995, pp. 132-133.

* cited by examiner

*Primary Examiner*—Huan Hoang
(74) *Attorney, Agent, or Firm*—Buchanan Ingersoll & Rooney PC

(57) ABSTRACT

A method of driving a multi-state organic memory device which includes an organic memory layer between upper and lower electrodes. The method comprises continuously applying voltages having different polarities to conduct switching into a low resistance state, and applying a single pulse to conduct switching into a high resistance state. A multi-state memory is realized using one memory device, since it is possible to gain three or more resistance states, thus significantly improving integration. The method has excellent reproducibility, and the resistance state induced by multiple pulses has an excellent nonvolatile characteristic.

25 Claims, 7 Drawing Sheets method of applying voltage

METHOD OF DRIVING MEMORY DEVICE TO IMPLEMENT MULTIPLE STATES

BACKGROUND OF THE INVENTION

This non-provisional application claims priority under 35 U.S.C. § 119(a) on Korean Patent Application No. 2005-5444 filed on Jan. 20, 2005, which is herein expressly incorporated by reference.

1. Field of the Invention

Embodiments of the present invention relate to a method of driving a memory device to implement multiple states. More particularly, embodiments of the present invention relate to a method of driving a memory device which includes an organic memory layer interposed between upper and lower electrodes so as to implement multiple states, in which switching using multiple pulses and typical switching using negative differential resistance (NDR) are employed to fabricate multi-state memory having at least three different resistance states.

2. Description of the Related Art

In accordance with recent advances in the information communication industry, demand for various memory devices is rapidly growing. Particularly, it is required that memory devices for mobile terminals, various kinds of smart cards, electronic money, digital cameras, memories for game, or MP3 players have nonvolatility so as to prevent recorded information from being erased even when power is turned off. Of nonvolatile memories, recently, flash memory based on silicon material has monopolized the market.

In conventional flash memory, the number of record/erase operations is limited, recording speed is slow, and a microfabrication process must be conducted to reduce the width of wire per unit area so as to create highly integrated memory capacity. With respect to this, there is a limit in that the fabrication cost of a memory chip increases as the cost of the above process increases and it is difficult to miniaturize the chip due to this technical limit. In accordance with disclosure of the technical limit of the conventional flash memory as described above, much effort has been made to develop a next generation nonvolatile memory device having ultra-high speed, high capacity, low power consumption, and low price characteristics so as to avoid the physical limits of conventional silicon memory devices.

Next generation memory is classified into ferroelectric RAM, magnetic RAM, phase change RAM, nanotube memory, holographic memory, and organic memory depending on the material constituting a cell as a basic unit of a semiconductor. Of them, in organic memory, organic material is interposed between upper and lower electrodes, and voltage is applied thereto to impart memory characteristics using bistability of a resistance value. In other words, organic memory is memory in which the resistance of the organic material between the upper and lower electrodes is reversibly changed by electric signals to record and read data '0' and '1'. Organic memory is largely expected to be the next generation memory because it implements nonvolatility, which is the advantage of conventional flash memory, and because it can avoid problems pertaining to processability, fabrication cost, and integration.

Japanese Patent Laid-Open Publication No. Sho. 62-95882 discloses a memory device using CuTCNQ (7,7,8,8-tetracyano-p-quinodimethane), that is, an organometallic complex charge transfer compound. U.S. Patent No. 2002-163057 introduces a semiconductor device comprising an intermediate layer in which ionic salts, such as NaCl or CsCl, are mixed with conductive polymer and which is interposed between upper and lower electrodes.

U.S. Patent No. 2004-27849 suggests an organic memory device in which metal nanoclusters are interposed between organic memory layers. However, this device is problematic in that it is very difficult to form the metal nanoclusters because of very low yield, and it is practically impossible to use it as a nonvolatile memory because of a rest phenomenon at OV voltage.

Meanwhile, a large-capacity memory device is required according to development in the informatization industry, and, recently, many studies have been conducted of a multi-bit, multi-level, or multi-state memory device as a technology for storing data having a plurality of bits in one memory cell so as to improve integration of the memory device. It is of essential importance in a large-capacity storage device to reduce the cost per bit. In order to meet this requirement, a technology significantly reducing the cost per bit of a flash EEPROM device is disclosed in IEEE, ISSCC Digest of Technical Papers, pp. 132-133, M. Bauer et al., February 1995, which is entitled "A Multilevel-Cell 32 Mb Flash Memory". The flash memory device disclosed in the above-mentioned document has a reduced cell size and 4 levels for 2 bits. In the flash memory device, if data corresponding to 4 levels for 2 bits are expressed using binary numbers, they correspond to 00, 01, 10, and 11, and predetermined threshold voltage levels are set corresponding to data, for example, 0=2.5 V, 1=1.5 V, 10=0.5 V, and 11=−3 V. Each memory cell has any one threshold voltage level of the four threshold voltage levels, and a binary datum of the binary data, such as 00, 01, 10, and 11, corresponding to the predetermined threshold voltage, is stored in the memory cell. As described above, typically, the multi-state flash memory device has two or more threshold voltage distributions and states corresponding to the threshold voltages ($V_{th}$).

U.S. Pat. No. 5,270,965 discloses a method of driving a memory device having a MIM (metal-insulator-metal) structure, which is capable of being operated in multiple values without a complicated fabrication process. In detail, it discloses the method of driving the memory device in which an organic memory layer is sandwiched between a pair of electrodes. The method comprises applying a first voltage higher than a predetermined voltage range between a pair of electrodes of the memory device to switch the device, in a first resistance state corresponding to a first resistance value of at least three resistance values, so as to be in a second resistance state of at least three resistance states; and applying a second voltage higher than a predetermined voltage range between a pair of electrodes of the memory device to switch the device, in the second resistance state corresponding to a second resistance value of at least three resistance values, so as to be in a third resistance state of at least three resistance states. However, this method is problematic in that, since reproducibility is low, practical usability is doubtful, and transition and switching among the states can be achieved only in a circulation manner.

OBJECTS AND SUMMARY

Accordingly, embodiments of the present invention have been made keeping in mind the above problems occurring in the related art, and an object of embodiments of the present invention is to provide a method of driving a memory device capable of being used as memory having multiple states and having excellent reproducibility, in which the device is driven using multiple pulses to induce a change in resistance.

Another object of embodiments of the present invention is to provide a method of driving an organic memory device, in which switching to a plurality of different resistance values can be achieved relatively rapidly and freely using a relatively low energy pulse.

In order to accomplish the above objects, embodiments of the present invention provide a method of driving a multi-state organic memory device which includes an organic memory layer between upper and lower electrodes. One method comprises a first step of continuously applying pulses having different polarities to conduct switching into a low resistance state; and a second step of applying a single pulse to conduct switching into a high resistance state.

BRIEF DESCRIPTION OF THE DRAWINGS

The above and other objects, features and advantages of embodiments of the present invention will be more clearly understood from the following detailed description taken in conjunction with the accompanying drawings, in which.

DETAILED DESCRIPTION OF THE PREFERRED EMBODIMENTS

Hereinafter, a detailed description will be given of embodiments of the present invention, referring to the accompanying drawings.

Embodiments of the present invention relate to a method of driving a memory device in which an organic memory layer is sandwiched between upper and lower electrodes to implement multiple states.

Figure 1:
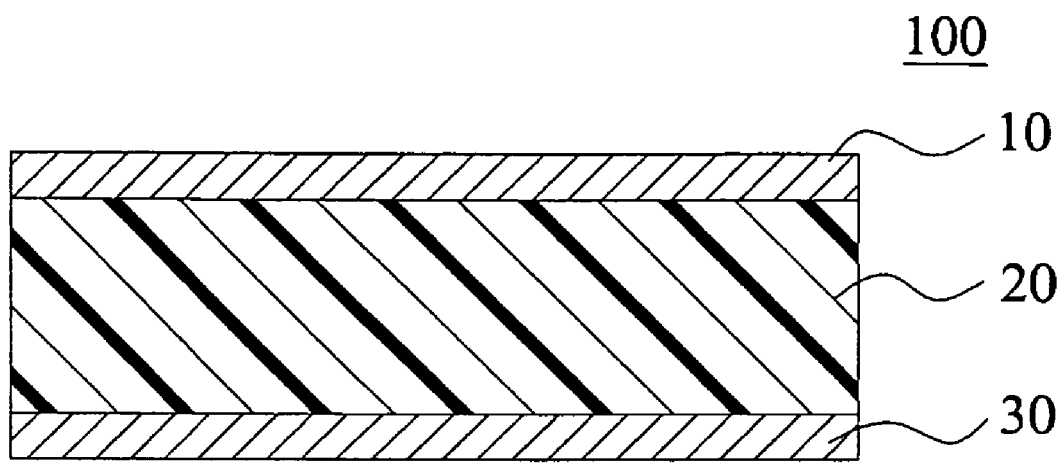
FIG. 1 is a schematic sectional view of a memory device used in embodiments of the present invention.

FIG. 1 is a schematic sectional view of a memory device which is capable of being used in a method of driving a memory device according to embodiments of the present invention. With reference to FIG. 1, in a memory device 100, an organic memory layer 20 is sandwiched between an upper electrode 10 and a lower electrode 30. If voltage is applied to the memory device 100, the resistance value of the organic memory layer 20 shows bistability, thereby exhibiting a memory characteristic. Furthermore, since the memory characteristic which results from the characteristics of the organic material is maintained as it is without any electric bias, the memory device is nonvolatile.

Figure 2:
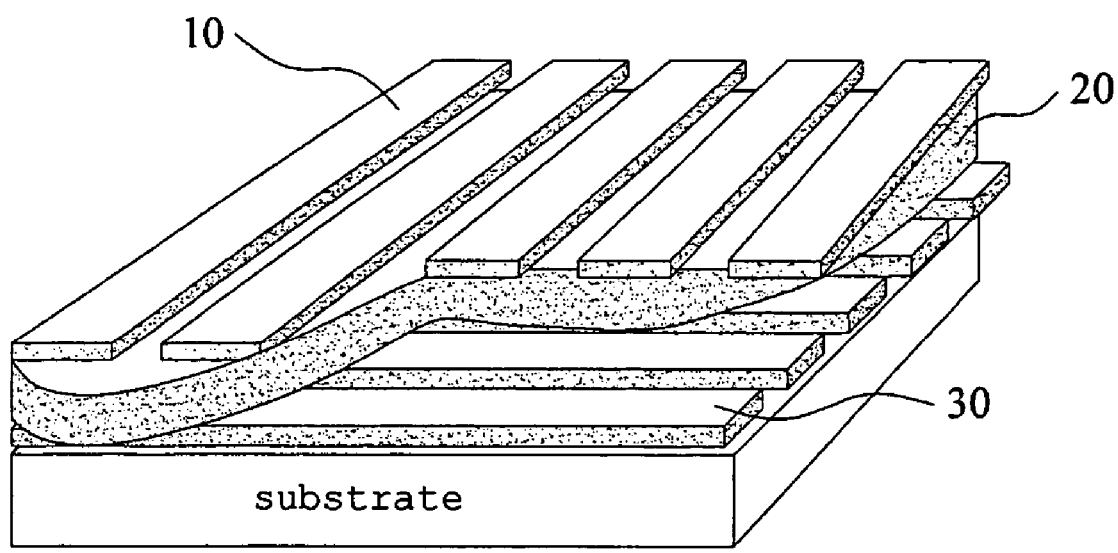
FIG. 2 is a perspective view of a memory matrix used in embodiments of the present invention.

FIG. 2 illustrates an example of a memory matrix used in embodiments of the present invention. As shown in FIG. 2, a memory matrix is designed on an appropriate substrate, such as glass or silicon. The memory matrix comprises upper electrodes 10 and lower electrodes 30, and an organic memory layer 20 is sandwiched therebetween. The substrate may be a typical organic-based or inorganic-based substrate, and particularly, a flexible substrate. A cell that is formed at an intersection point of a upper electrode 10 and a lower electrode 30 provides bistability.

As shown in FIGS. 1 and 2, in the device, which includes the lower electrode 30, the organic memory layer 20, and the upper electrode 10, sequentially layered, when metal capable of easily being diffused is added to organics, a novel memory phenomenon occurs. The phenomenon is characterized in that, if pulses having different polarities are continuously applied, for example, if positive voltage is applied and negative voltage is subsequently applied, switching of resistance occurs. The switched resistance is much lower than the resistance switched using typical NDR (negative differential resistance).

Embodiments of the present invention are characterized in that switching caused by multiple pulses and switching using the typical NDR (negative differential resistance) are simultaneously employed to implement multi-state memory.

Figure 3:
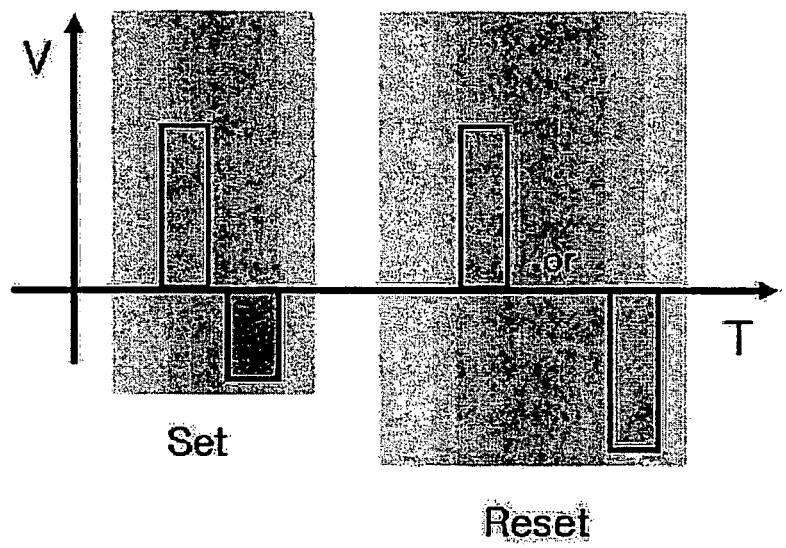
FIG. 3 illustrates graphs showing the application of voltage according to a method of embodiments of the present invention.
Figure 4:
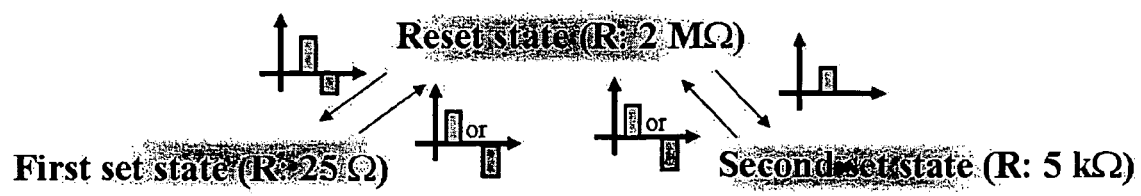
FIG. 4 illustrates electric characteristic graphs showing multiple states when using a driving method according to embodiments of the present invention.

FIG. 3 illustrates the application of voltage in order to implement a multi-state memory device according to embodiments of the present invention. FIG. 4 illustrates states of resistances according to embodiments of the present invention. As shown in FIG. 3, if a predetermined threshold positive voltage or more is applied to the memory device and negative voltage is subsequently applied (set state), a switching phenomenon occurs upon the application of negative voltage. Subsequently, a single pulse of the negative voltage or the positive voltage is applied in the threshold voltage or more to conduct switching to a high resistance state (reset state).

Figure 5:
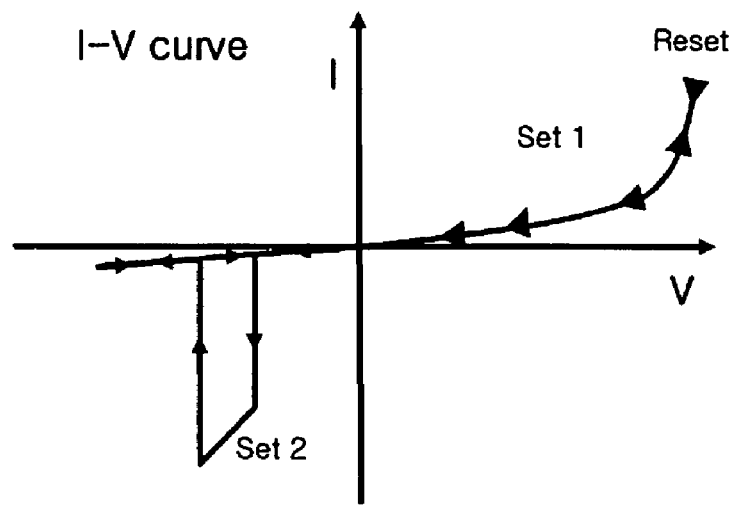
FIG. 5 is a current-voltage (I-V) characteristic graph of a memory device when using a driving method according to embodiments of the present invention.

After the voltage is applied between the upper and lower electrodes of a memory device having a structure shown in FIG. 1 to drive it through a method of embodiments of the present invention, current and voltage characteristics are evaluated, resulting in the finding that there are three or more states having different electroconductivities. For example, as roughly shown in FIGS. 4 and 5, it is possible to form a first set state (resistance of about 25 $\Omega$), a reset state (about 2 M$\Omega$), and a second set state (about 5 k$\Omega$). Each state has a memory characteristic. Switching from one state to another state is made possible by applying the voltage through a driving method according to embodiments of the present invention. Referring to FIG. 5, a predetermined threshold positive voltage or more is applied to a memory device and the negative voltage is subsequently applied thereto to form the first set state (set 1). The reset state is formed by applying a single pulse of the positive voltage or negative voltage in the first set state. The second set state is formed by applying a predetermined positive voltage. The positive voltage is applied to switch from the second set state to the reset state. With respect to this, the voltage is higher than that used when switching into the second set state. It is possible to conduct switching from the reset state to the first or second set state and to conduct switching from the first or second set state to the reset state. However, it is possible to conduct switching from the second set state to the first set state using only multiple pulses. In this case, transition into the reset state is carried out using a first pulse of the multiple pulses. Switching from the first set state to the second set state is difficult to achieve using the single pulse, but is made possible using the multiple pulses. That is to say, switching into the reset state is conducted using the first pulse, and switching into the second set state is conducted using the second pulse.

Figure 6A:
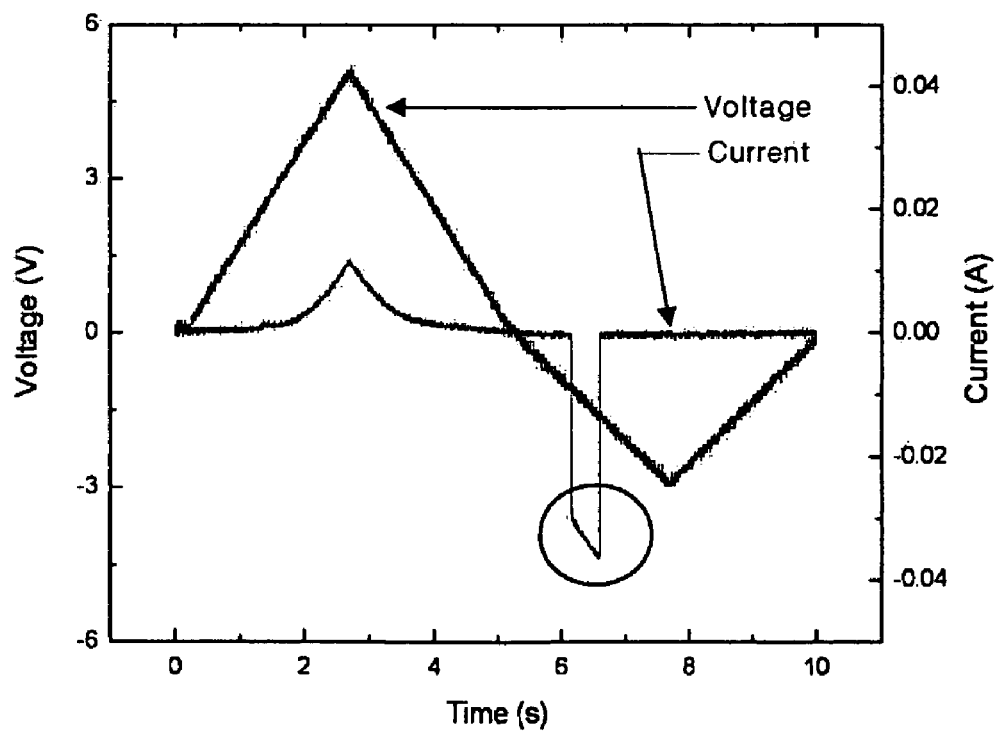
FIG. 6a is a graph showing current and voltage as a function of time when a memory device is driven using multiple pulses, according to embodiments of the present invention.
Figure 6B:
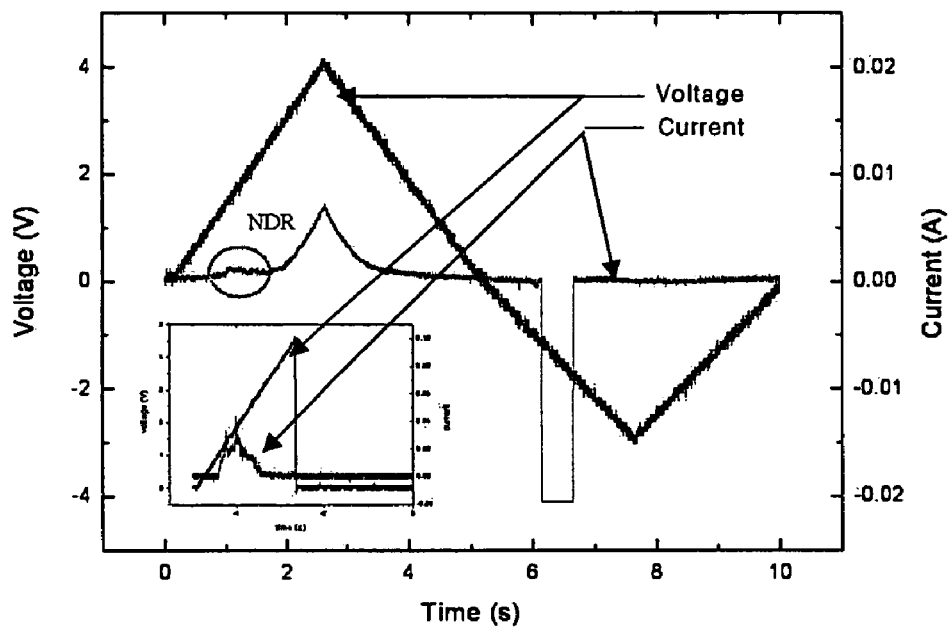
FIG. 6b is a graph showing current and voltage as a function of time when a memory device is driven using a single pulse.

FIGS. 6a and 6b are graphs showing current and voltage as a function of time when voltage applied to a memory device is continuously increased and reduced, according to embodiments of the present invention. As shown in FIG. 6a, in an organic memory device which includes an organic memory layer interposed between upper and lower electrodes, if a predetermined threshold positive voltage or more is applied and negative voltage is subsequently applied, switching occurs upon the application of the negative voltage. That is to say, if driving is conducted using multiple pulses, switching into a very low resistance state can be achieved. Meanwhile, if a single pulse is subsequently applied, as shown in FIG. 6b, a negative differential resistance (NDR) effect occurs. To conduct switching into the second set state, application of voltage is stopped at the voltage at which the current has reached a maximum value. Furthermore, higher voltage is applied in order to conduct switching into the reset state. As confirmed by an enlarged graph of FIG. 6b, the slope of the current-time characteristic curve in the graph sometimes has a negative value. This occurs because charges are trapped due to the loss of voltage when the charges are neither implanted nor discharged. After the charges have been trapped, embodiments of the present invention achieve switching using the multiple pulses in conjunction with typical switching using negative differential resistance (NDR) to implement a multi-state memory having three or more states (see FIG. 4).

In a memory device of embodiments of the present invention, the organic memory layer 20 may comprise any polymer capable of specifically interacting with metal ions. The polymer may include one or more selected from the group consisting of conjugated polymer, anisotropic electroconductive material, organic semiconductor, and polymer containing an intramolecular charge-transfer complex, but is not limited to them. The organic memory layer may be formed of a single layer or multiple layers, such as two or more layers.

In embodiments of the present invention, the organic memory layer 20 may be formed using a spin coating method, an inkjet printing method, a roll-to-roll coating method, or a thermal evaporation method. The thickness of the organic memory layer 20 is preferably about 50-3000 Å. Acetone, cyclopentanon, cyclohexanon, methylethylketone ethyl cellosolve acetate, butyl acetate, ethylene glycol, toluene, xylene chloroform, tetrahydrofuran, dimethyl formamide, chlorobenzene, or acetonitrile may be used alone or combined at a predetermined combination ratio as a solvent available for a spin coating method.

In embodiments of the present invention, the upper electrode 10 and the lower electrode 30 may include one or more electroconductive materials selected from the group consisting of metals, metal alloys, metal nitrides, oxides, sulfides, carbon and conductive polymers, and organic conductors. Illustrative, but non-limiting, examples of the electrode material include aluminum (Al), gold (Au), silver (Ag), platinum (Pt), copper (Cu), titanium (Ti), tungsten (W), and indium tin oxide (ITO).

Examples of the conductive polymer include polyacetylene-based polymer, such as poly(diphenylacetylene), poly (t-butyl)diphenylacetylene, poly(trifluoromethyl)diphenylacetylene, poly(bistrifluoromethyl)acetylene, polybis(t-butyldiphenyl)acetylene, poly(trimethylsilyl) diphenylacetylene, poly(carbasol)diphenylacetylene, polydiacetylene, polyphenylacetylene, polypyridineacetylene, polymethoxyphenylacetylene, polymethylphenylacetylene, poly(t-butyl)phenylacetylene, polynitrophenylacetylene, poly(trifluoromethyl)phenylacetylene, poly (trimethylsilyl)phenylacetylene, and a derivative thereof, polythiophene, poly(n-vinylpyridine), poly(dimethylsiloxane), poly(ethylene-oxide), poly(acrylic acid), poly(methyl acrylic acid), poly(styrene-sulfonic acid), poly(cyclopentadienylmethyl-norbornene), and poly(amino acid).

The upper electrode 10 and the lower electrode 30 may be formed using a typical method, such as an evaporation method, for example, thermal evaporation, a sputtering method, an e-beam evaporation method, or a spin coating method.

In embodiments of the present invention, a barrier layer may be additionally formed between the organic layer and the lower electrode or between the organic layer and the upper electrode. The barrier layer includes material selected from the group consisting of $SiO_x$, $AlO_x$, $NbO_x$, $TiO_x$, $CrO_x$, $VO_x$, $TaO_x$, $CuO_x$, $MgO_x$, $WO_x$, and $AlNO_x$, and preferably includes material selected from the group consisting of $SiO_2$, $Al_2O_3$, $Cu_2O$, $TiO_2$, BN (boron nitrite), and $V_2O_3$. In embodiments of the present invention, the barrier layer may be made of organic material, such as $Alq_3$, polymethylmethacrylate, polystyrene, and PET. It is preferable that the thickness of the barrier layer be 5-300 Å.

A better understanding of embodiments of the present invention may be obtained through the following examples which are set forth to illustrate, but are not to be construed as limiting the present invention.

EXAMPLE 1

Fabrication of Test Memory Device

Aluminum was deposited on a glass substrate using a thermal evaporation method to form a lower electrode, and a barrier layer ($Al_2O_3$) was formed to a thickness of 1-2 nm thereon using a spontaneous oxidation method. Subsequently, the barrier layer was coated with a solution in which $P_3HT$ was dissolved through a spin coating process, and then baked at 65° C. for 10 min to form an organic memory layer. An Au electrode was deposited as an upper electrode thereon through the thermal evaporation method, thereby fabricating a test device. In this case, the thickness of the organic memory layer was 30 nm and the thickness of the electrodes was 80 nm, measured using an alpha-step profilometer. The thickness of the deposited electrode was controlled using a quartz crystal monitor.

EXAMPLE 2

Driving of Test Device to Implement Multiple States

Figure 7A:
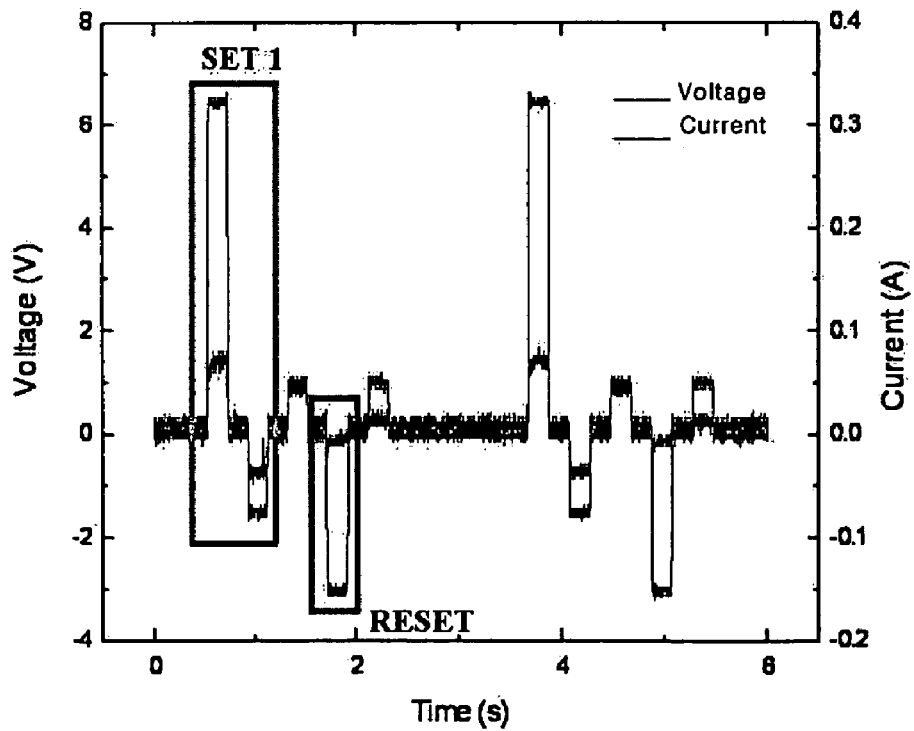
FIG. 7a is a graph showing switching achieved using multiple pulses according to embodiments of the present invention.
Figure 7B:
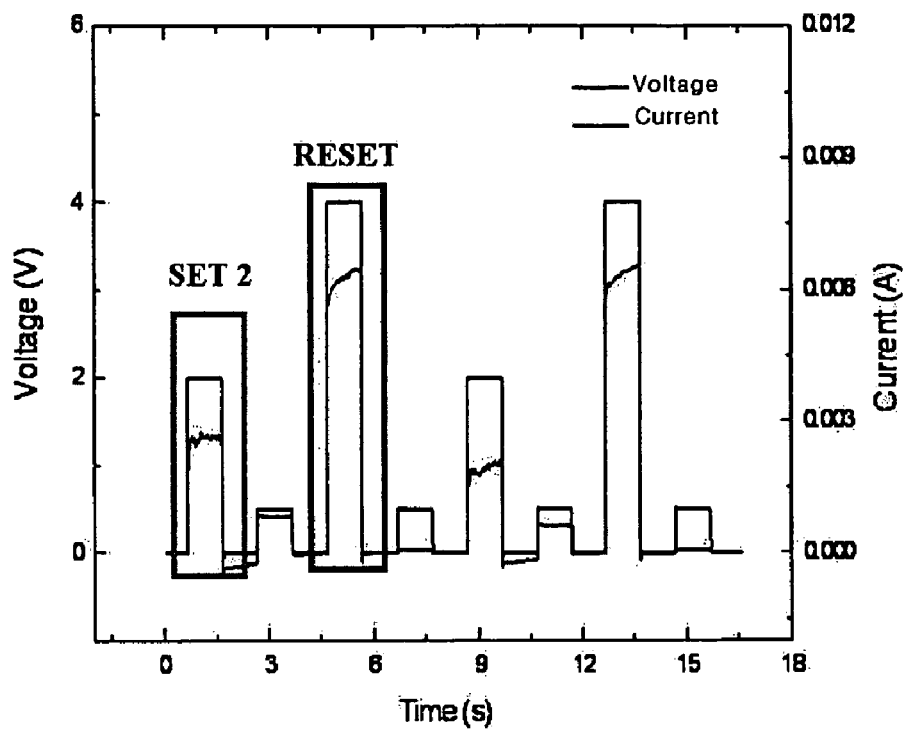
FIG. 7b is a graph showing a negative differential resistance effect caused by driving using a single pulse according to embodiments of the present invention.

Current-voltage (I-V) characteristics of a test device, which was driven according to a method of embodiments of the present invention, were measured, and the results are shown in FIG. 7a. Referring to FIG. 7a, a positive voltage pulse of 6.2 V and a negative voltage pulse of −1.7 V were continuously applied to a memory device in a reset state, thereby conducting switching into a low resistance state (a first set). This was confirmed from the observation that a current had a relatively high value when a reading voltage of 1 V was applied. Subsequently, if the negative voltage of −3 V was applied, switching into a reset state was conducted, which was confirmed from the observation that the current had a low value at the reading voltage. FIG. 7b is a graph showing switching employing a negative differential resistance effect caused by driving using a single pulse. Switching from the reset state to a second set state was achieved using the single pulse, and switching into the reset state was conducted when voltage of 4 V was applied. Each state was confirmed from the magnitude of current flowing at a detection voltage of 0.5 V. The detection current after a set switching voltage was much higher than the detection current after the reset switching.

EXAMPLE 3

Test for Duration Time of Switching State of Memory Device

Figure 8A:
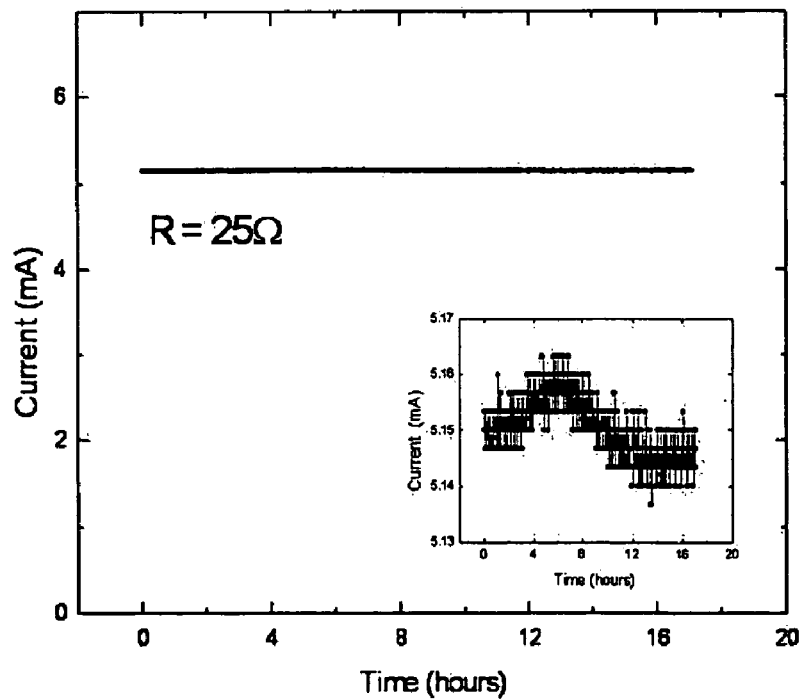
FIG. 8a is a graph showing duration time of a first set state.
Figure 8B:
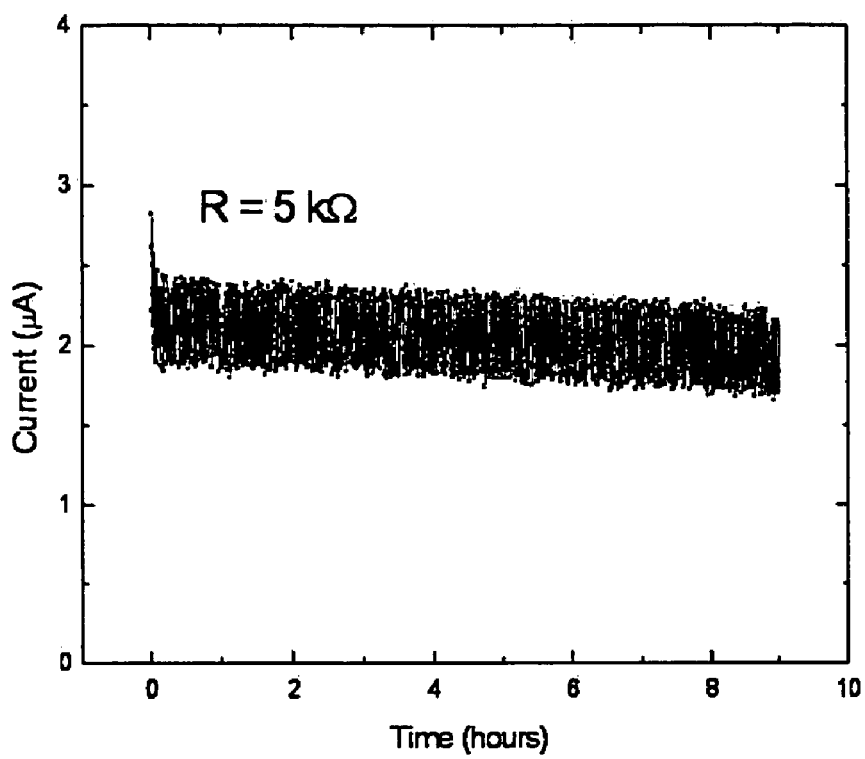
FIG. 8b is a graph showing duration time of a second set state.

A memory device of embodiments of the present invention is nonvolatile, which means that information is capable of being stored for a long time. FIG. 8a is a graph showing a duration time in a first set state, and FIG. 8b is a graph showing a duration time in a second set state. In FIGS. 8a and 8b, voltage of 0.05 V was applied to a memory device at room temperature, and a change in the state of the memory device was detected using current. In FIG. 8a, a slight change in current was detected, which meant duration of the first set state, but attenuation was not observed during the detection. On the other hand, in the second state, slight attenuation was observed, and the magnitude of the measured current was small, thus noise occurred. From FIGS. 8a and 8b, it can be seen that it is possible to store information for a long time using the first and second set states.

EXAMPLE 4

Reproduction Test of Memory Device

Figure 9A:
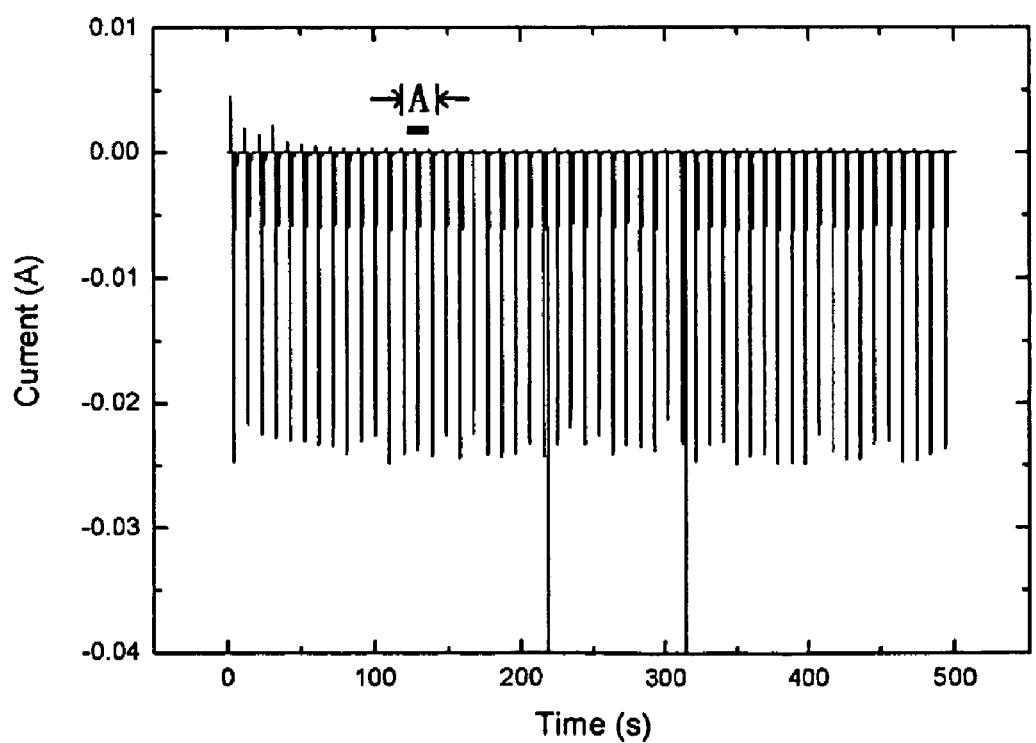
FIGS. 9a and 9b are graphs showing current and voltage characteristics when driving is conducted 50 times or more through a driving method of embodiments of the present invention.
Figure 9B:
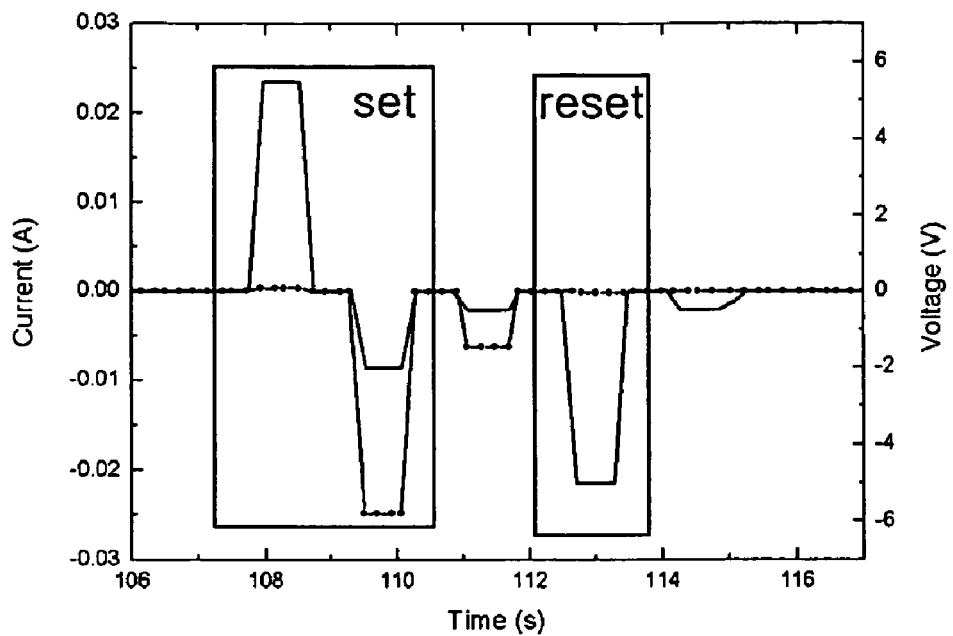
Figure 10:
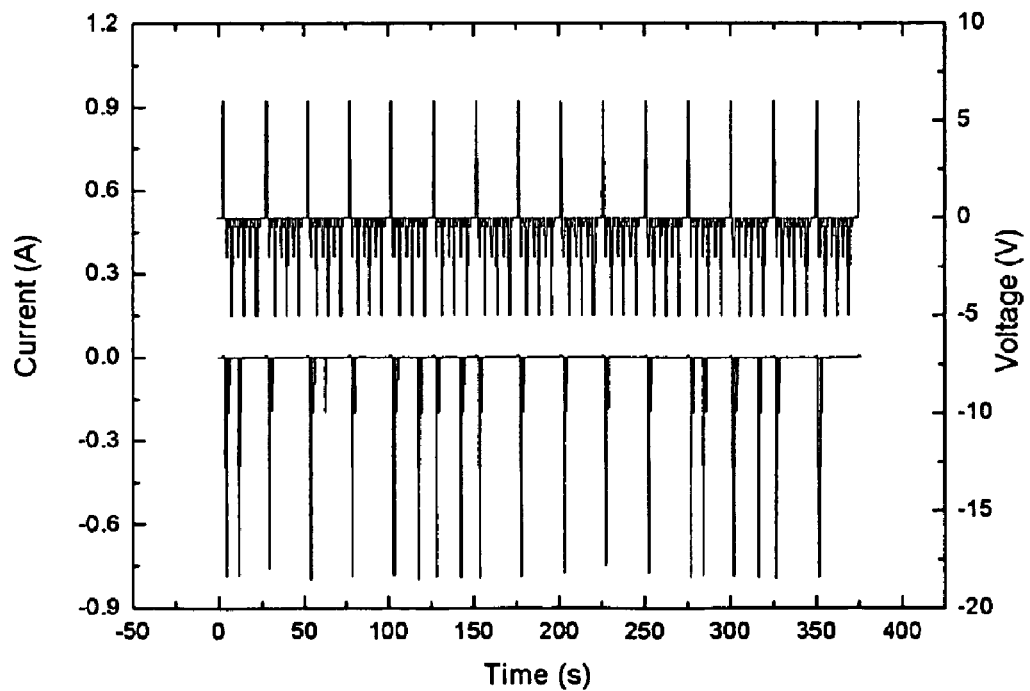
FIG. 10 is a graph showing the results after driving has been conducted 50 times using a single pulse.

FIGS. 9a and 9b are graphs showing current and voltage characteristics when driving is conducted 50 times or more through a driving method of embodiments of the present invention. As shown in FIG. 9a, when the memory device was driven using multiple pulses through the method of embodiments of the present invention, switching was observed with reproduction of 50 times or more. FIG. 9b is an expanded view of a portion A of FIG. 9a. In FIG. 9b, switching into a set state was conducted using multiple pulses having positive and negative voltages, and the state was confirmed using the negative voltage of −0.5 V. After switching into the reset state was conducted using a negative voltage pulse of −5 V, the state was confirmed using the negative voltage of −0.5 V. Unlike this, FIG. 10 is a graph showing the results after the driving is conducted using a single pulse, in which multi-pulse switching and single pulse switching were continuously conducted once and twice, respectively. When using the multi-pulse, switching into the set state occurred, but, when using the single pulse, the possibility of switching into the set state was very low.

In embodiments of the present invention, since it is possible to gain three or more resistance states, a multi-state memory is realized using one memory device, thus significantly improving integration. Furthermore, the driving method of embodiments of the present invention has excellent reproducibility, and a resistance state induced by multiple pulses has an excellent nonvolatile characteristic, thus it can be applied to a nonvolatile large-capacity storage device. In addition, embodiments of the present invention are advantageous in that switching between states is not conducted only through a circulation process but may be freely conducted using appropriate voltage.

Embodiments of the present invention have been described in an illustrative manner, and it is to be understood that the terminology used is intended to be in the nature of description rather than of limitation. Many modifications and variations of embodiments of the present invention are possible in light of the above teachings. Therefore, it is to be understood that within the scope of the appended claims, the invention may be practiced otherwise than as specifically described.

What is claimed is:

1. A method of driving a multi-state organic memory device comprising an organic memory layer between upper and lower electrodes, comprising:
    a first step of continuously applying pulses having different polarities to conduct switching into a low resistance state; and
    a second step of applying a single pulse to the upper and lower electrodes to conduct switching into a high resistance state.

2. The method as set forth in claim 1, wherein positive and negative voltage pulses are continuously applied to conduct switching into the low resistance state in the first step.

3. The method as set forth in claim 1, wherein a single positive voltage or a single negative voltage is applied to conduct switching into the high resistance state in the second step.

4. The method as set forth in claim 1, wherein the multi-state organic memory device is a memory matrix comprises an organic memory layer between upper electrodes and lower electrodes.

5. The method as set forth in claim 1, wherein the organic memory layer comprises at least one material selected from the group consisting of conjugated polymer, anisotropic electroconductive material, organic semiconductor, and polymer containing an intramolecular charge-transfer complex.

6. The method as set forth in claim 1, wherein the organic memory layer consists of a single layer.

7. The method as set forth in claim 1, wherein the organic memory layer comprises multiple layers.

8. The method as set forth in claim 1, wherein a thickness of the organic memory layer is about 50-3000 Å.

9. The method as set forth in claim 1, wherein the organic memory layer is formed using a spin coating method,
    wherein a solvent for the spin coating method is selected from the group consisting of acetone, cyclopentanon, cyclohexanon, methylethylketone ethyl cellosolve acetate, butyl acetate, ethylene glycol, toluene, xylene chloroform, tetrahydrofuran, dimethyl formamide, chlorobenzene, and acetonitrile.

10. The method as set forth in claim 1, wherein at least one of the upper and lower electrodes comprise one or more electroconductive materials selected from the group consisting of metal, a metal alloy, metal nitride, oxide, sulfide, carbon and conductive polymers, and an organic conductor.

11. The method as set forth in claim 10, wherein the conductive polymer comprises material selected from a group consisting of polyacetylene-based polymer, polythiophene, poly(n-vinylpyridine), poly(dimethylsiloxane), poly(ethylene-oxide), poly(acrylic acid), poly(methyl acrylic acid), poly(styrene-sulfonic acid), poly(cyclopentadienylmethyl-norbornene), and poly(amino acid).

12. The method as set forth in claim 1, wherein at least one of the upper and lower electrodes comprise one or more electroconductive materials selected from the group consisting of aluminum, gold, silver, platinum, copper, titanium, tungsten, and indium tin oxide.

13. The method as set forth in claim 1, wherein the memory device further comprises a barrier layer between the organic layer and the lower electrode, or between the organic layer and the upper electrode.

14. The method as set forth in claim 13, wherein the barrier layer comprises inorganic material which is selected from the group consisting of $SiO_x$, $AlO_x$, $NbO_x$, $TiO_x$, $CrO_x$, $VO_x$, $TaO_x$, $CuO_x$, $MgO_x$, $WO_x$, and $AlNO_x$, or organic material which is selected from a group consisting of $Alq_3$, polymethylmethacrylate, polystyrene, and PET.

15. The method as set forth in claim 14, wherein the barrier layer comprises a substance selected from the group consisting of $SiO_2$, $Al_2O_3$, $Cu_2O$, $TiO_2$, BN (boron nitrite), and $V_2O_3$.

16. The method as set forth in claim 13, wherein a thickness of the barrier layer is about 5-300 Å.

17. A method of driving an organic memory device comprising an organic memory layer between upper and lower electrodes, the organic memory device having a plurality of stable resistance states including a first state, a second state and a reset state such that a resistance of the first state is lower than a resistance of the second state and the resistance of the second state is lower than a resistance of the reset state, the method comprising:
a first step of applying a plurality of voltage pulses having different polarities to the upper and lower electrodes to put the organic memory device into the first state; and
a second step of applying a single voltage pulse to put the organic memory device into the reset state.

18. The method as set forth in claim 17, wherein the first step is carried out when the organic memory device is in the second state.

19. The method as set forth in claim 17, wherein the first step comprises:
applying a positive voltage pulse; and
applying a negative voltage pulse after applying the positive voltage pulse.

20. The method as set forth in claim 19, wherein the positive voltage is greater than or equal to a predetermined threshold voltage.

21. The method as set forth in claim 17, wherein the second step is carried out when the organic memory device is in the first state or the second state.

22. The method as set forth in claim 17, further comprising:
a third step of applying a positive voltage pulse to put the organic memory device into the second state when the organic memory device is in the reset state.

23. The method as set forth in claim 22,
wherein the single voltage pulse to put the organic memory device into the reset state in the second step is a positive voltage pulse, and
wherein the positive voltage pulse applied in the second step is higher than the positive voltage pulse applied in the third step.

24. The method as set forth in claim 22, wherein the positive voltage pulse applied in the third step is stopped when current flowing through the organic memory device reaches a maximum.

25. A method of driving a multi-state organic memory device comprising an organic memory layer between upper and lower electrodes, comprising:
a first step of continuously applying pulses having different polarities to conduct switching into a first set state;
a second step of applying a single pulse to the device at the first set state to conduct switching into a high resistance reset state; and
a third step of applying a positive pulse to the device at the reset state to conduct switching into a second set state whose resistance is higher than the resistance of the first set state and is lower than the resistance of the reset state.

* * * * *